United States Patent
Chatty et al.

(10) Patent No.: US 7,825,475 B2
(45) Date of Patent: Nov. 2, 2010

(54) MIXED VOLTAGE TOLERANT INPUT/OUTPUT ELECTROSTATIC DISCHARGE DEVICES

(75) Inventors: Kiran V. Chatty, Williston, VT (US); David Alvarez, Munich (DE); Bong Jae Kwon, Yongin (KR); Christian C. Russ, Diedorf (DE)

(73) Assignees: International Business Machines Corporation, Armonk, NY (US); Samsung Electronics Co., Ltd. (KR); Infineon Technologies AG (DE)

( * ) Notice: Subject to any disclaimer, the term of this patent is extended or adjusted under 35 U.S.C. 154(b) by 206 days.

(21) Appl. No.: 12/168,936

(22) Filed: Jul. 8, 2008

(65) Prior Publication Data

US 2010/0006944 A1    Jan. 14, 2010

(51) Int. Cl.
*H01L 23/62*    (2006.01)
(52) U.S. Cl. .................. 257/358; 257/360; 257/355; 257/E27.015; 257/E27.105; 361/56; 361/111
(58) Field of Classification Search ......... 257/355–360, 257/167–168; 361/56, 111–115
See application file for complete search history.

(56) References Cited

U.S. PATENT DOCUMENTS

| 5,512,766 A | 4/1996 | Kusunoki et al. |
|---|---|---|
| 5,939,756 A | 8/1999 | Lee |
| 6,724,050 B2 | 4/2004 | Salling et al. |
| 6,803,633 B2 * | 10/2004 | Mergens et al. ............. 257/358 |
| 6,875,650 B2 | 4/2005 | Salling et al. |
| 7,046,067 B2 | 5/2006 | Chung |
| 7,061,737 B2 | 6/2006 | Chen |
| 7,302,378 B2 | 11/2007 | Hayashi |
| 2003/0134479 A1 | 7/2003 | Salling et al. |
| 2003/0137029 A1 | 7/2003 | Salling et al. |
| 2004/0082133 A1 | 4/2004 | Salling et al. |
| 2005/0077938 A1 | 4/2005 | Dale et al. |
| 2005/0212558 A1 | 9/2005 | Chung |
| 2005/0219782 A1 | 10/2005 | Chen |

* cited by examiner

*Primary Examiner*—Dung A. Le
(74) *Attorney, Agent, or Firm*—Cantor Colburn LLP; Yuanmin Cai

(57) ABSTRACT

An input/output (I/O) mixed-voltage drive circuit and electrostatic discharge protection device for coupling to an I/O pad. The device includes an NFET device having a gate, a drain, a source and body, the gate adapted for coupling to a pre-drive circuit, the source and the body being coupled to one another and to ground. The device also includes a bipolar junction transistor having a collector, an emitter and a base, the emitter being coupled to the drain of the NFET and the collector being coupled to the I/O pad.

13 Claims, 7 Drawing Sheets

MIXED VOLTAGE TOLERANT INPUT/OUTPUT ELECTROSTATIC DISCHARGE DEVICES

BACKGROUND

This invention relates generally to electronic circuits and, and more particularly to providing mixed voltage tolerant input/output electrostatic discharge devices.

Input/output (I/O) devices operate at different voltages. As such, electronic circuitry utilized in I/O devices should be able to operate at different voltages. For instance, I/O devices may be able to operate at 3.3 or 5 volts. Typically, these devices utilize complementary-symmetry metal-oxide-semiconductor (CMOS) technologies and, in particular, utilize field effect transistors (FETs) to drive other circuits and to handle electrostatic discharges (ESD). In some instances, due to availability and space constraints, a 3.3 or 5V FET may not be used. In these instances, stacked or cascoded n-channel field effect transistors (NFETs) are routinely used in mixed-voltage tolerant I/O connections. For instance, a 2.5V stacked NFET (two 2.5 volt serially connected NFET's) is often used for 3.3 or 5V applications if a 3.3 or 5V NFET is not available in the technology or it may be used for cost or area reasons.

Stacked NFETs are essentially two NFETs in series that may be implemented in a single active area with a minimum gate spacing, or they can be implemented in separate active areas. A single active area with minimum gate spacing implementation is preferred due to a smaller resultant device area.

FIG. 1 shows a schematic of a prior art stacked NFET circuit 100. The circuit 100 includes an I/O pad 102. The I/O pad 102 may receive an input from or provide an output to an external device (not shown). The voltage received on the I/O pad 102 may vary. For example, the voltage received on the I/O pad could be 3.3 or 5V. The I/O pad is connected to stacked NFET 104. The stacked NFET 104 includes two NFET's, a first NFET 106 and a second NFET 108. The stacked NFET 104, as is known in the art, functions as both an electrostatic (ESD) device and as a driver circuit. From time to time herein, the first NFET 106 may be referred to as the "top NFET."

In particular, the second NFET 108, may have its gate coupled to a pre-drive circuit (not shown) to drive an external circuit. In the example shown, the I/O pad 102 is coupled to the drain of the first NFET 106. The source of the first NFET 106 is coupled to the drain of the second NFET 108, the bodies of both the first NFET 106 and the second NFET and the source of the second NFET 108 are coupled together and to ground. The gate of the first NFET 106 is coupled, either directly or through a normally-on PFET, to a supply voltage (VDD) and the gate of the second NFET 108 is coupled to a pre-drive circuit.

FIG. 2 depicts cross-section of the circuit 100 of FIG. 1 as implemented in silicon. The drain pad 102 is coupled to the drain 202 of the first NFET 106. As shown, the first NFET 106 is formed of first drain 202, first gate 204, first source and a body region 208. In more detail, the first drain 202 comprises an N+ region, the first source comprises an N+ region 206, both of which are formed in the P-well body region 208. The first gate 204 is coupled to VDD. The second NFET 108 includes a second drain co-formed with the first source in N+ region 206, a second gate 212, and a second source 210. The second drain and the second source 210 are N+ regions formed in the P-well body region 208. The second source 210 is separated from a p-contact region 214 by a shallow trench isolation region 215. The second source 210 and the p-contact region 214 are coupled to one another and to ground. The entire assembly of FIG. 2 is formed on a P-substrate 216 that serves as a starting material. In this example, the first NFET 106 and second NFET 108 handle ESD and drive an external circuit.

While the circuits described above may work well for their intended purposes, these circuits may have shortcomings. For instance, these circuits may not have tunable ESD trigger voltages, may have on-currents that are too low, or may have gate oxide breakdown issues. Thus, a device that may solve one more of these shortcomings is desired.

SUMMARY

An exemplary embodiment includes an input/output (I/O) mixed-voltage electrostatic discharge protection device for coupling to an I/O pad. The device of this embodiment includes an NFET device having a gate, a drain, a source and body, the gate adapted for coupling to a pre-drive circuit, the source and the body being coupled to one another and to ground. The device of this embodiment also includes a bipolar junction transistor having a collector, an emitter and a base, the emitter being coupled to the drain of the NFET and the collector being coupled to the I/O pad.

Another embodiment of the present invention includes a method of creating a mixed voltage input/output device with electrostatic discharge protection. The method of this embodiment includes forming an NFET on a P-substrate, the NFET including being formed in a p-well located on the P-substrate and including a drain, a source, a gate and a body, wherein the drain and the source are formed by N+ regions disposed in the p-well, the body is formed by a P+ region disposed in the p-well and separated from the source by a shallow trench isolation region, and the gate is formed between the source and the drain; coupling the source and the body to one another and to a ground contact; forming a resistive device in the p-well, the resistive device including a bipolar junction transistor and a resistive element, the bipolar junction transistor including a base, a collector and an emitter, the collector being formed by an N+ region disposed in the p-well, the emitter being formed by the source, and wherein the resistive element is formed by an N+ region formed in the p-well and located between the collector and the emitter.

Another embodiment of the present invention is directed to a method of creating a mixed voltage input/output device with electrostatic discharge protection. The method of this embodiment includes providing a P-substrate; forming an N-band on a portion of the P-substrate; forming a p-well on another portion of the P-substrate and contacting the N-band; forming a border N region on top of a portion of the N-band and contacting a side portion of the p-well; forming an isolated p-well on top of another portion of the N-band; forming a drain region, the drain region being an N+ region and being located on top of the border N+ region and extending into both the p-well and the isolated p-well; forming a source region and an body region in the p-well, the source region being an N+ region and the body region being a P+ region; coupling a gate connector between the source and the drain; and forming a bipolar junction transistor in the isolated p-well, the bipolar junction transistor including an emitter formed by the drain, a base, and a collector, the base being formed in part by a P+ well disposed in the isolated p-well and separated from the collector, the collector being formed by a N+ region disposed in the isolated p-well.

BRIEF DESCRIPTION OF THE SEVERAL VIEWS OF THE DRAWINGS

Referring now to the drawings wherein like elements are numbered alike in the several FIGURES.

DETAILED DESCRIPTION

As discussed above, the prior art may not provide circuits or devices that have tunable ESD trigger voltages, low on-currents, or that may experience gate oxide breakdown issues. In more detail, ESD protection in mixed voltage tolerant I/O's is typically implemented in a self-protected configuration or a non-self-protected configuration. In a self-protected configuration, an ESD NFET also functions as an NFET driver under normal operating conditions. Under this scheme, small trigger and clamping voltages of ESD NFETs are preferred to keep pad voltage as small as possible during ESD discharge. In a non-self protected configuration, an NFET driver is typically a silicided stacked NFET and there is a separate ESD device (for example, string diodes). Under this scheme, a large ESD trigger voltage is preferred to prevent triggering of NFET driver since a silicided NFET cannot handle current under ESD conditions. Thus, a tunable trigger voltage of an NFET driver is desired.

Also, the on-current of a stacked NFET is approximately 50% lower compared to a single NFET since two NFETs are in series. This lower on-current drives a larger device width and therefore larger area (approximately 2× for single active area case, 4× for separate active area configurations). Thus, it is desirable to improve on-current of stacked NFET.

Stacked NFETs also suffer from gate oxide breakdown issues under ESD stress due to large electric fields between that the drain and the gate of the upper NFET. Thus, a structure that eliminates or reduces the gate oxide breakdown issues is desired.

In one embodiment, the present invention may overcome some or all of the above drawbacks by replacing the top NFET of a conventional stacked NFET with a channel implanted resistor implement using a silicide-blocking mask. Such a device may have a higher on-current compared to a conventional stacked NFET due to the implanted channel. Further, by varying doping concentration or depth of the implanted channel, the trigger voltage of the structure can be changed which may prove useful in reducing trigger voltage of a self-protected NFET or increasing the trigger voltage of a non-self protected NFET. Additionally, doping in the channel can be adjusted to drop voltage at I/O pad by allowing the channel implant region to deplete into P-well/substrate.

Figure 3:
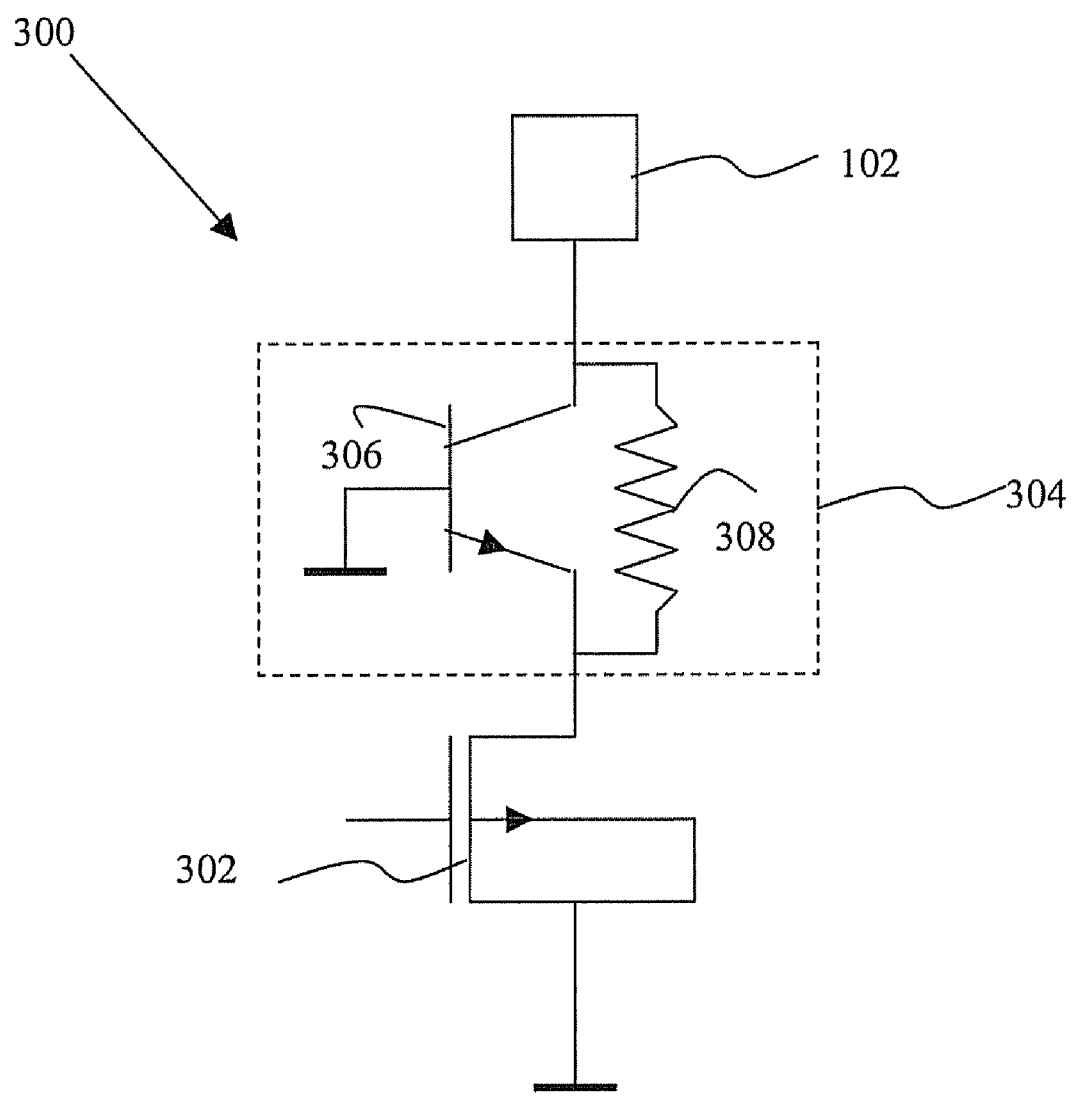
FIG. 3 depicts a circuit diagram of one embodiment of a stacked mixed voltage device according to the present invention.

FIG. 3 shows a circuit diagram of one embodiment of the present invention. The circuit 300 may be coupled, as in the previous circuits, to an I/O pad 102. The circuit 300 includes an NFET 302. The source and body of the NFET 302 are coupled to one another and to ground. The gate of the NFET 302 may be coupled to a pre-drive circuit (not shown). The circuit 300 also includes a channel implanted resistor implement 304 coupled between the I/O pad 102 and the drain of the NFET 302.

The channel implanted resistor implement 304 is schematically shown as an NPN bipolar junction transistor (BJT) 306 having a resistive element 308 coupled in parallel across its emitter and collector. As shown, the collector of the NPN BJT 306 is coupled to the I/O pad 102 and the emitter of the NPN BJT 306 is coupled to the drain of the NFET 302.

Figure 1:
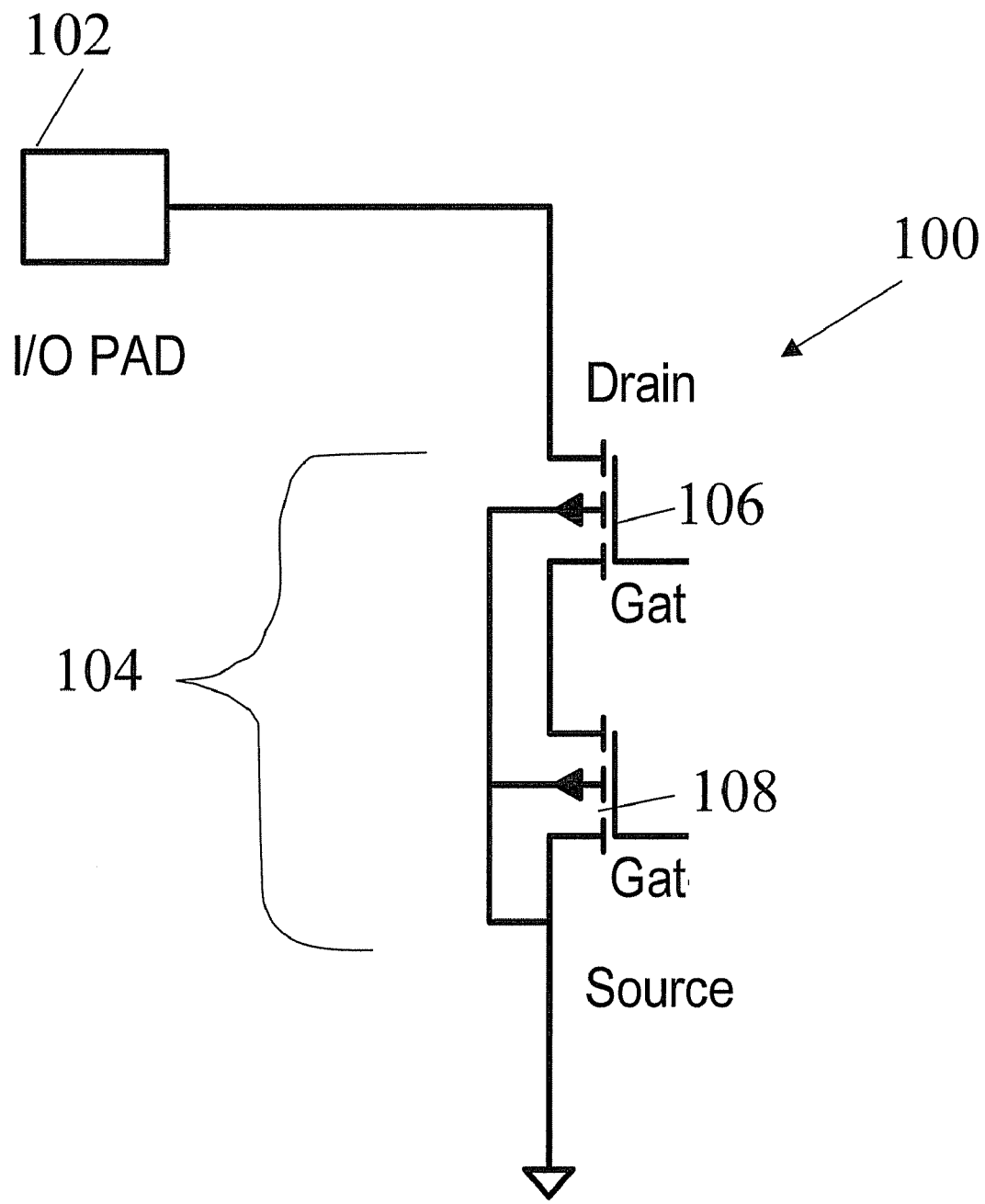
FIG. 1 depicts a circuit diagram for a prior art stacked NFET device.
Figure 2:
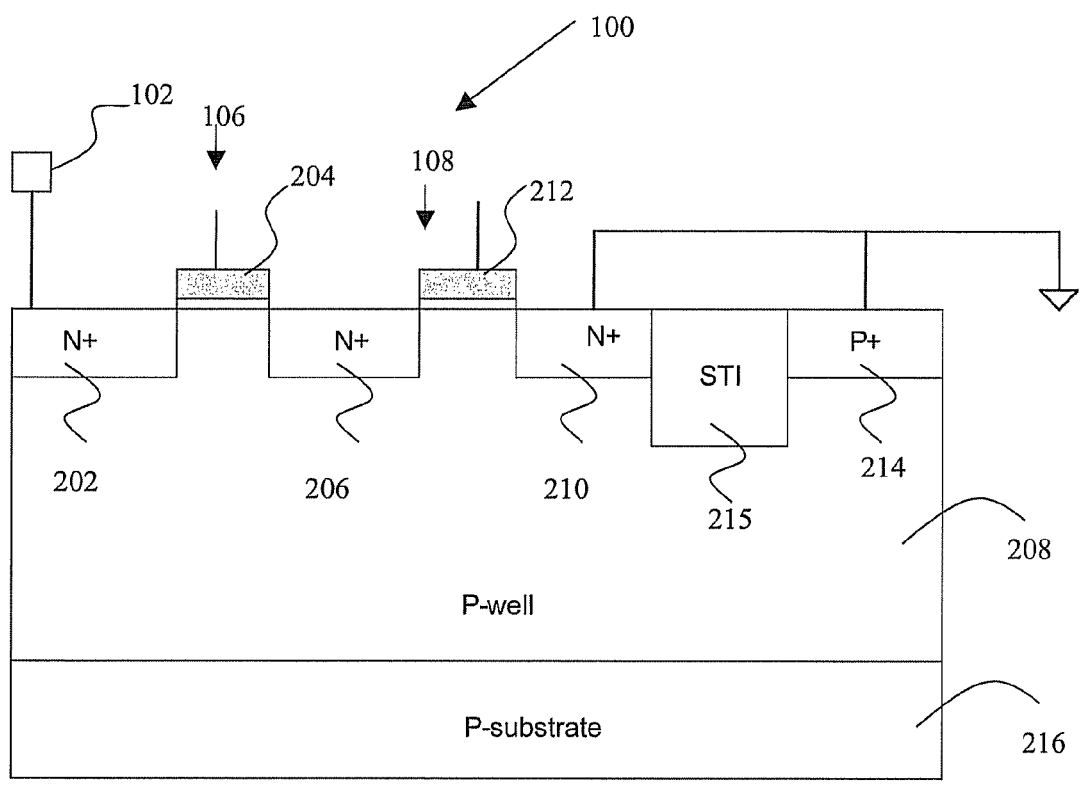
FIG. 2 depicts a prior stacked NFET as implemented in silicon.
Figure 4:
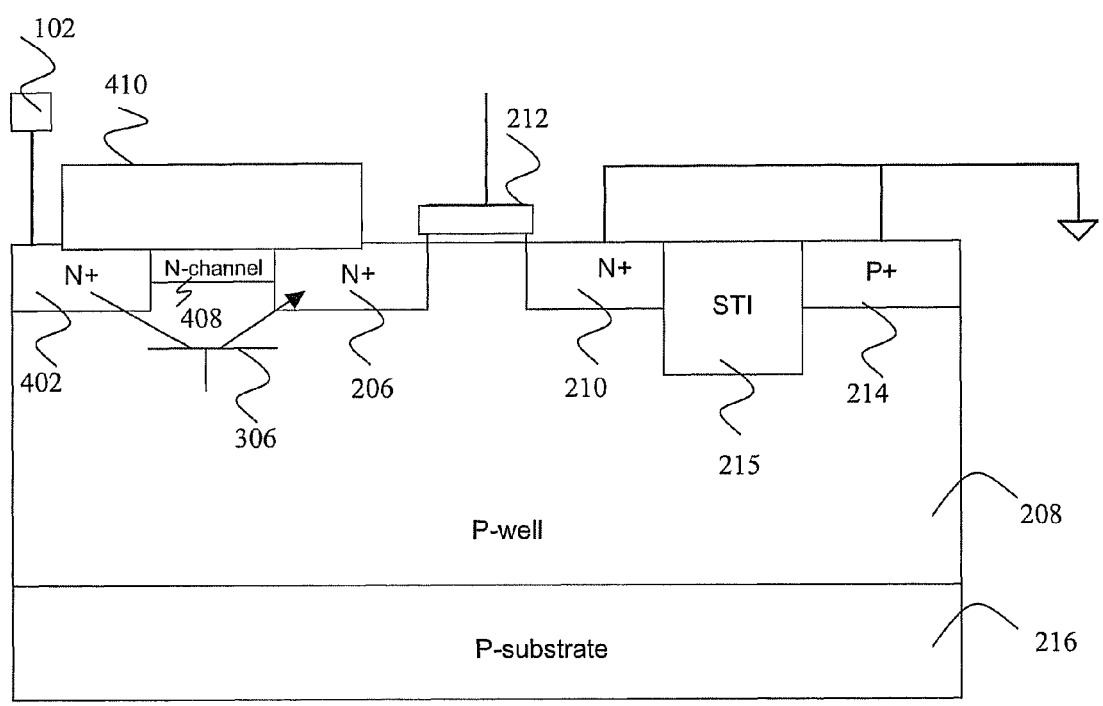
FIG. 4 depicts one implementation of the circuit shown in FIG. 3 as it may be implemented in silicon.

FIG. 4 shows an example of the circuit 300 shown in FIG. 3 as it may be implemented as a silicon based device. The resistive device 304 includes the NPN BJT transistor 306 which is formed by the collector region 402, the P-well body region 208, and the first emitter formed by N+ region 206. In particular, the collector region 402 and the emitter are N+ regions formed in the P-well body region 208. In contrast to the device shown in FIG. 2, the NPN BJT 306 does not include a gate. As such, the device does not encounter gate oxide break down.

The resistive device 304 also includes a resistive element as described above. In FIG. 4, the resistive element is implemented as N+ region 408. As shown, the N+ region 408 is disposed between the collector region 402 and the N+ region 206. The resistive qualities of the N-channel 408 may lead to an increased on-current than a conventional stacked NFET. Furthermore, as discussed above, varying doping concentration or depth of the N+ region 408, the trigger voltage of structure can be changed which may prove useful in reducing trigger voltage of a self-protected NFET or increasing the trigger voltage of a non-self-protected NFETs.

The N+ region 408 and portions of both the collector region 402 and the N+ region 206 may include silicide blocking layer disposed thereon. In one embodiment, a hard mask 410 for forming the silicide blocking layer may be silicon nitride and, as one of skill in the art will realize, the silicide-blocked region serves to spread ESD currents for improved ESD current handling.

The NFET 302 (FIG. 3) includes a drain formed by the N+ region 206, a gate 212, and a source 210. The drain and the source 210 are N+ regions formed in the P-well body region 208. The source 210 is separated from a p-contact region 214 by a shallow trench isolation region 215. The source 210 and the p-contact region 214 are coupled to one another and to ground.

Figure 5:
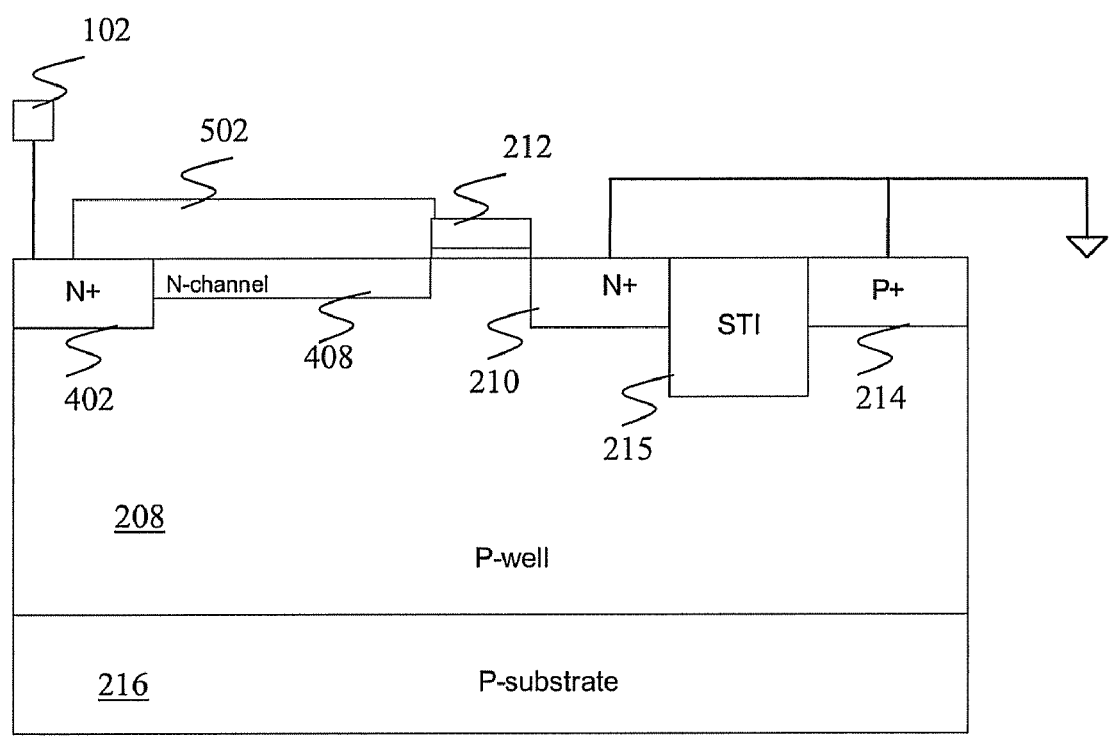
FIG. 5 depicts another implementation of the circuit shown in FIG. 3 as it may be implemented in silicon.

FIG. 5 shows another example of the circuit shown in FIG. 3 as it may be implemented as a silicon based device. In this embodiment, the N+ region 408 is extended to the edge of the gate 212. As such, the N+ region 408 serves as both the drain of the NFET 302 and the emitter of the BJT 306.

In particular, the device shown in FIG. 5 includes a collector 402 embodied as an N+ region displaced in the P-well 208. The collector 402 may be coupled, in some embodiments, to the I/O pad 102. The collector 402 may be contacted by the N+ region 408. The N+ region 408 is disposed in the P-well 208. A portion of the collector 402 has a silicide blocking element 502 (eg. silicon nitride) disposed on top of it. The silicide blocking element 502 may also be disposed on top of all or a substantial length of the N+ region 408. The silicon nitride region prevents the formation of silicide below it, while silicide formation occurs on regions where the silicon nitride hard mask does not exist.

The NFET 302 is formed by the N-channel 408, the second gate 212, and the source 210. The source 210 is an N+ region formed in the P-well body region 208. The source 210 is separated from a p-contact region 214 by a shallow trench isolation region 215. The source 210 and the p-contact region 214 are coupled to one another and to ground.

Figure 6:
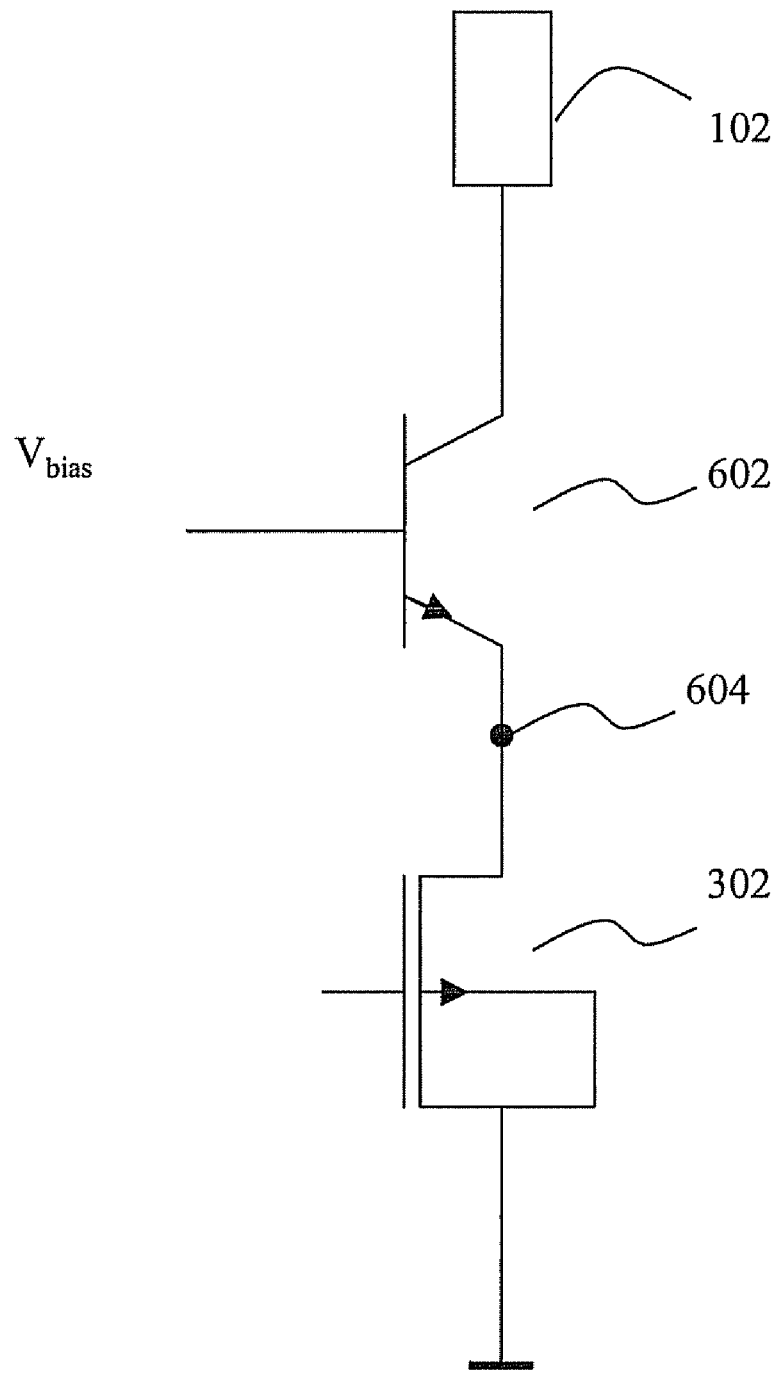
FIG. 6 depicts a circuit diagram of another embodiment of a stacked mixed voltage device according to the present invention.

FIG. 6 shows a circuit 600 according to another embodiment of the present invention. In this embodiment, the upper NFET of a conventional stacked MOS transistor is replaced by a lateral NPN 602. In this embodiment, the I/O pad 102 is coupled to the collector of the lateral NPN 602. The emitter of the lateral NPN 602 is coupled to the drain of the second NFET 302. As before, the source and the body of the NFET 302 are coupled to one another and to the ground. The gate of the NFET 302 may be coupled to a pre-drive circuit (not shown). Advantageously, utilizing a BJT allows the circuit 600 to provide more current than a conventionally stacked MOS device.

In one embodiment, the base of the lateral NPN 602 is coupled to a biasing voltage. The voltage between the drain of the NFET 302 and the collector of the lateral NPN is limited to $V_{be}$ (base-emitter voltage) which is controlled by the biasing voltage. In operation, when the gate of the second NFET 302 is driven high, the voltage at node 604 between the lateral NPN 602 and the NFET 302 is pulled to ground. The advantage of such a circuit is reflected in the larger drive capability of the lateral NPN compared to MOS (NFET) devices and also there are no gate oxide reliability issues. When the gate of the second NFET 302 is driven low, node 604 becomes high-ohmic and the voltage is set at $V_{bias}$ ($V_{be}$) (emitter follower) ensuring MOS-gate oxide reliability while high IO pad 102 voltage can be applied.

Figure 7:
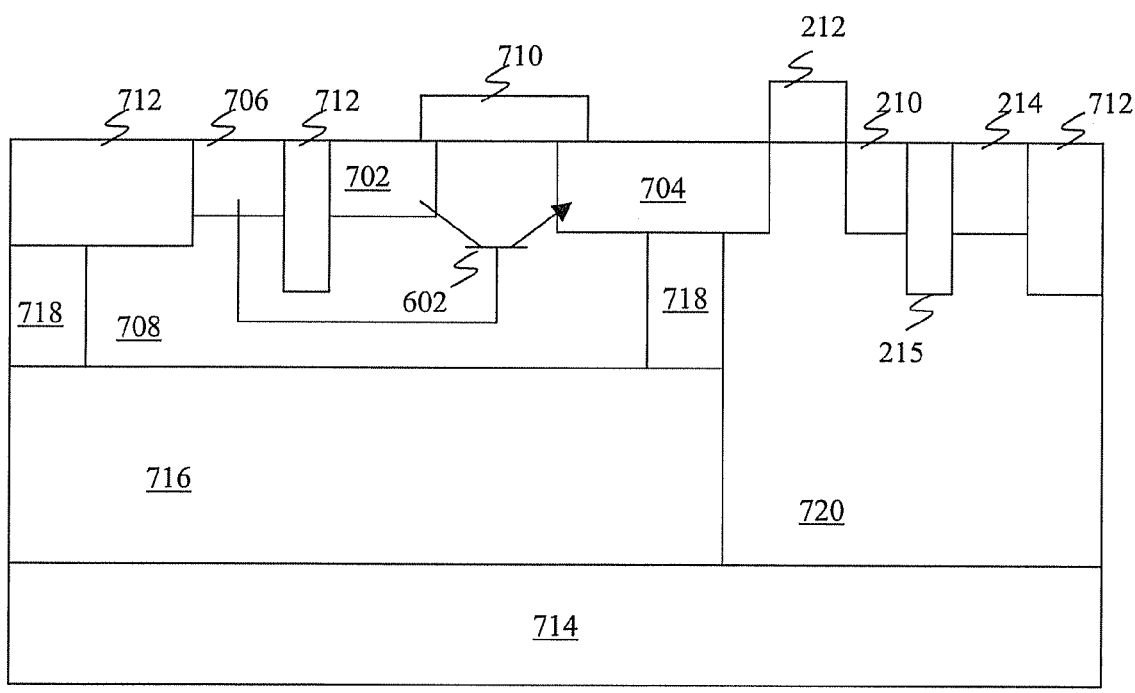
FIG. 7 depicts one implementation of the circuit shown in FIG. 6 as it may be implemented in silicon.

FIG. 7 shows an example of how the circuit 600 of FIG. 6, may be implemented in silicon. The lateral NPN 602 is formed by a collector 702, a emitter 704 and a base 706. The collector 702, the emitter 704 and the base 706 are all formed in an isolated P-well 708. In one embodiment, the collector 702 and the emitter 704 are N+ regions and the base terminal (706) is a P+ region.

Portions of the collector 702 and emitter 704 are covered by a silicide blocking layer 710. In some embodiments, the silicide blocking layer may cover the isolated P-well 708 completely. The base terminal 706 is separated from the collector 702 by a separating region 712.

In one embodiment, the isolated P-well 708 is separated from the P-substrate 714 by an N-band region 716. The isolated P-well 708 may also be separated from any other P-wells by border N regions 718.

The NFET 302 includes a drain 704 (co-formed with the emitter 704), a gate 212, and a source 210. The drain 206 and the source 210 are N+ regions formed in the P-well body region 720. The source 210 is separated from a p-contact region 214 by a shallow trench isolation region 215. The source 210 and the p-contact region 214 are coupled to one another and to ground.

The isolated P-well 708 in combination with the N-band 716 is creating the base region for the lateral NPN 602 and allows for the application of a biasing potential (through base terminal 706) to form an emitter follower. An emitter follower reduces the voltage at region 704 to lower levels thus, reducing gate oxide breakdown issues. Reducing gate oxide breakdown issues make such a circuit more suitable for higher I/O voltage applications.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. An input/output (I/O) mixed-voltage electrostatic discharge protection device for coupling to an I/O pad, the device comprising:
    an NFET device having a gate, a drain, a source and body, the gate adapted for coupling to a pre-drive circuit, the source and the body being coupled to one another and to ground;
    a bipolar junction transistor having a collector, an emitter and a base, the emitter being coupled to the drain of the NFET and the collector being configured to couple to the I/O pad; and
    a resistive element coupled across the collector and emitter.

2. The device of claim 1, wherein the collector is coupled to the I/O pad.

3. The device of claim 1, wherein the resistive element is an N-region

4. The device of claim 3, wherein the NFET device and the bipolar junction transistor are formed in a common P-well.

5. The device of claim 4, wherein the drain is a formed by an N+ region formed in the P-well and the source is formed by an N+ region formed in the P-well and wherein the source is separated from a body contact region by a shallow trench isolator.

6. The device of claim 5, wherein the base of the bipolar junction transistor is formed by the P-well, the collector is formed by an N+ region disposed in the P-well, and the emitter is co-formed with the drain.

7. The device of claim 6, wherein the N-region is disposed between the collector and the emitter.

8. The device of claim 7, further comprising a silicide blocking layer disposed over the N-region and at least a portion the collector and the emitter.

9. The device of claim 4, wherein the drain and the emitter are formed by the N-region and the source is formed by an N+ region formed in the P-well and wherein the source is separated from a body contact region by a shallow trench isolator.

10. The device of claim 9, wherein the collector is formed by an N+ region disposed in the P-well and the N-region and a portion of the collector are covered by a silicide blocking layer.

11. The device of claim 1, wherein the device includes an isolated p-well and a p-well separated from one another by an N-region, the isolated p-well being separated from a P-substrate by an N-band and N-well regions.

12. The device of claim 11, wherein the collector is an N+ region formed in the isolated p-well, the emitter is an N+ region formed in both the isolated p-well and the p-well and the isolated p-well is coupled to a biasing voltage via a P+ region formed therein.

13. The device of claim 12, wherein the drain is a co-formed with the emitter, the source is formed by an N+ region formed in the p-well and the source is separated from a body contact region by a shallow trench isolator.

* * * * *